United States Patent [19]
Yokozaki et al.

[11] Patent Number: 5,448,774
[45] Date of Patent: Sep. 5, 1995

[54] INTERMITTENT OPERATION RECEIVER

[75] Inventors: Katsushi Yokozaki, Yokohama; Yasumi Imagawa, Kanazawa, both of Japan

[73] Assignee: Matsushita Electric Industrial Co., Ltd., Osaka, Japan

[21] Appl. No.: 229,109

[22] Filed: Apr. 18, 1994

Related U.S. Application Data

[63] Continuation of Ser. No. 948,571, Sep. 23, 1992, abandoned.

[30] Foreign Application Priority Data

Oct. 9, 1991 [JP] Japan .................. 3-261774

[51] Int. Cl.⁶ .................................. H04B 1/16
[52] U.S. Cl. .................. 455/343; 455/228; 455/234.1; 455/38.3; 340/825.44
[58] Field of Search .............. 455/343, 38, 38.2, 38.3, 455/228, 234.1, 249.1; 375/98; 370/95.3, 95.1; 340/825.44, 825.57

[56] References Cited

U.S. PATENT DOCUMENTS

| | | | |
|---|---|---|---|
| 4,506,386 | 3/1985 | Ichikawa et al. | 455/38.3 |
| 5,050,192 | 9/1991 | Nawata | 455/249.1 |
| 5,119,508 | 6/1992 | Shamasundara | 455/234.1 |
| 5,175,882 | 12/1992 | Higashijima | 455/234.1 |
| 5,184,349 | 2/1993 | Riordan | 455/249.1 |
| 5,204,977 | 4/1993 | Feldt | 370/95.3 |

FOREIGN PATENT DOCUMENTS

| | | |
|---|---|---|
| 486139 | 3/1992 | Japan . |
| 2233846 | 1/1991 | United Kingdom . |
| 90/06021 | 5/1990 | WIPO . |

OTHER PUBLICATIONS

DE-Buch, "Funktechnik mit integrierten Schaltungen", Beam Verlag, 1984, Kapitel 1.1. u .4.5.

Primary Examiner—Edward F. Urban
Assistant Examiner—Philip J. Sobutka
Attorney, Agent, or Firm—Stevens, Davis, Miller & Mosher

[57] ABSTRACT

A direct conversion type FSK receiver has an intermittent reception mode and includes a detecting and holding device in a low frequency unit and a gain control device in a high frequency unit. The receiver starts a reception operation in response to an intermittent reception control signal and controls the gain of the high frequency unit based on the detection of the received signal strength level before an interval of time during which the receiver receives a signal transmitted for the receiver and maintains the controlled gain for that interval of time. As a result, the receiver has reduced reception disturbance, which disturbance is due to intermodulation occurring when a large input signal is received.

1 Claim, 6 Drawing Sheets

INTERMITTENT OPERATION RECEIVER

This application is a continuation of application Ser. No. 07/948,571, filed Sep. 23, 1992 (abandoned).

BACKGROUND OF THE INVENTION

1. Field of the Invention

The present invention relates to intermittent operation receivers such as pagers.

2. Description of the Prior Art

Recently, in FSK (Frequency Shift Keying) receivers such as pagers, direct conversion systems have begun to be put to practical use. In such systems the main portions of the receivers may be formed as an IC without requiring any expensive and large-sized individual parts such as high and intermediate frequency filters to achieve miniaturization and cost reduction (see Japanese Patent Publication JP-A-4-86139). There are systems which directly convert the received signals to a lower frequency signal (corresponding to a frequency deviation) to demodulate the desired signal by low frequency signal processing.

In such systems, mentioned above, however, the low frequency section produces a large amount of noise compared to heterodyne systems. In order to control such noise, an increase in the gain of the high frequency section is required. If no filters are used in the high frequency section, such system is susceptible to disturbance of reception due to possible intermodulation occurring when a large input signal is received.

In order to cope with this situation, provision of filters in the high frequency section is effective, which would be a hindrance to miniaturization and cost reduction of the receivers. Such arrangement cannot constitute a receiver which is capable of switching channels. Another effective measure is the use of an automatic gain control method which detects a received signal strength to control the gain of the high frequency section when a large signal is received.

However, since the conventional automatic gain control system is composed of a large feedback loop, it would take some time for control to shift from the detection of a received signal strength to the start of control of the gain of the high frequency section. Thus the use of such automatic gain control system in intermittent operation receivers such as pagers is difficult.

SUMMARY OF THE INVENTION

The present invention solves such conventional problems. It is an object of the present invention to provide an intermittent operation receiver which performs an intermittent reception such as a pager, and is capable of reducing disturbance of reception due to intermodulation occurring when a large input signal is received, without adversely affecting the reception of signals.

In order to achieve the above object, the present invention provides an intermittent operation receiver which comprises a received signal strength detecting and holding means in a low frequency unit and a gain control means in a high frequency unit. The receiver detects the level of the received signal strength and controls the gain of the high frequency unit in accordance with the detected level after the start of receiver operation under the intermittent reception control before an interval of time during which the receiver receives desired signals and maintains the controlled gain during that interval of time.

Accordingly, according to the present invention, the gain of the high frequency unit is controlled without adversely affecting the reception of desired signals to thereby reduce disturbance of reception due to intermodulation occurring when a large input signal is received.

DESCRIPTION OF THE PREFERRED EMBODIMENTS

Figure 1:
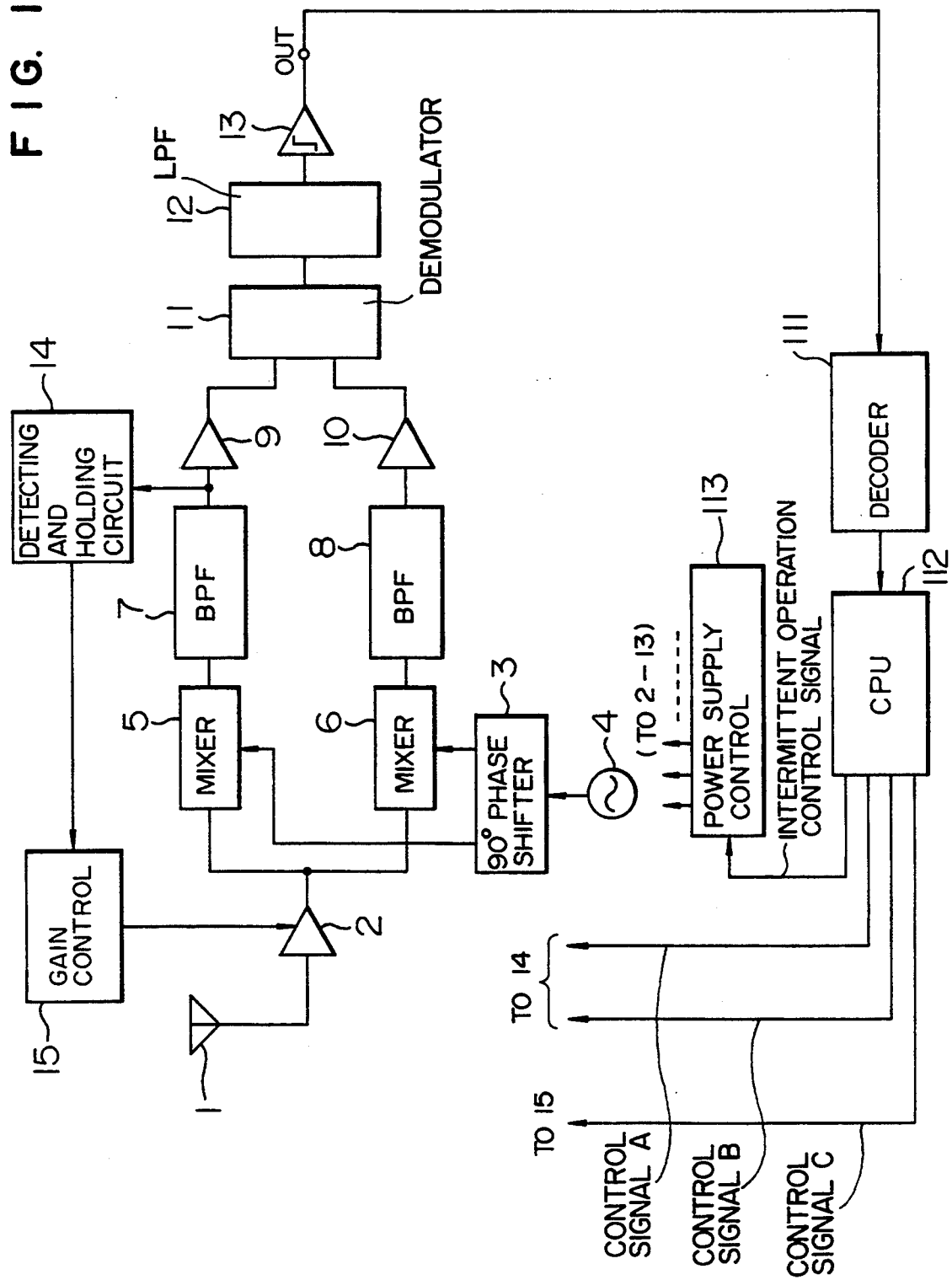
FIG. 1 is a block diagram indicative of the overall structure of a direct conversion FSK receiver in a first embodiment of the present invention.

FIG. 1 is a block diagram indicative of the overall structure of a direct conversion FSK receiver in a first embodiment of the present invention. In FIG. 1, reference numeral 1 denotes an antenna which receives a transmitted signal; and 2, a high frequency amplifier connected to the antenna 1 and having the function of gain control. Connected to the amplifier 2 are mixers 5, 6 to which a local oscillator 4 is connected through a 90 degree phase shifter 3. The local oscillating signal from the local oscillator 4 is separated by the phase shifter 3 into two signals which are out of phase 90 degrees with respect to each other. These signals are then input to the mixers 5 and 6. Since the received signal and the local oscillating signal have the same frequency in the direct conversion receiver, each output from the two mixers 5 and 6 corresponds to a frequency deviation in the FSK modulation.

The output signals from the two mixers 5 and 6 are input to band pass filters 7 and 8, respectively, to filter out out-of-band noise and adjacent channel signals. The signals which have passed through the filters 7 and 8 are then amplified by the corresponding limiter amplifiers 9 and 10 to a level which is high enough to operate a demodulator 11 even if the input signals are very weak so that they are close to a minimum sensible level, and the resulting signals are then inputted to the demodulator 11.

The demodulator 11 demodulates the received signals, using the fact that the phase difference between the two output signals from the mixers 5 and 6 is decided in accordance with a value of transmitted data such as "0" or "1". The data demodulated by the demodulator 11 are shaped by a low pass filter 12 and a comparator 13 and then delivered through an output terminal OUT to a decoder 111, which detects a sync signal, and sync signal detecting information is delivered to a CPU 112 to determine a reception operation mode. That is, after a power supply switch of the receiver is turned on, the receiver performs in a continuous operation mode. When the sync signal can be detected, the receiver shifts to an intermittent operation mode in which the receiver operates for only a constant interval of time containing the time duration of the sync signal. In order to call the receiver, an address signal determined beforehand for each receiver is transmitted following the sync signal. When the receiver detects the address signal which designates the receiver itself, it shifts to a continuous reception mode for a constant interval of time, and sounds a beep, which provides an indication of the calling of the receiver, or displays the received message on a display. CPU 112 generates an intermittent operation control signal which controls the operation of the receiver in accordance with such reception mode and applies the signal to a power supply control unit 113, which supplies the respective units 2–13 with power supply control signals. In the intermittent reception mode the supply of current is performed intermittently to thereby reduce power consumption in the receiver. The CPU 112 generates control signals A–C which control the operations of a detecting and holding circuit 14 and gain control means 15.

The detecting and holding circuit 14 for detecting a received signal strength level and holding a detected signal level is one of the features of the present embodiment and has the gain control means 15 connected thereto. The gain control means 15 controls the gain of the high frequency amplifier 2 in accordance with the output signal from the detecting and holding circuit 14.

Figure 2:
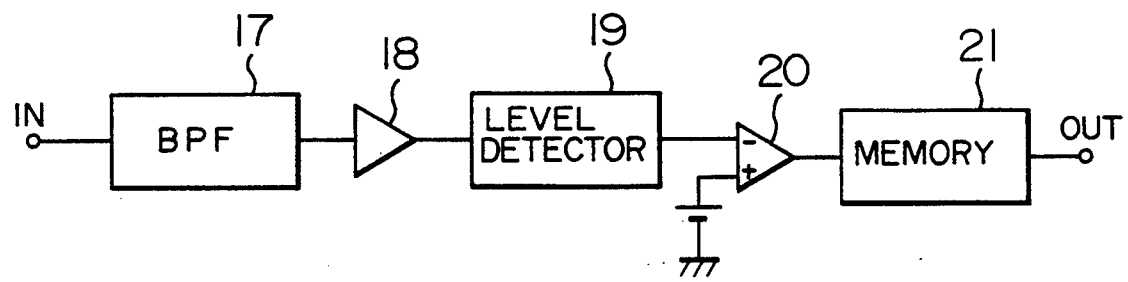
FIG. 2 is a block diagram indicative of a detecting and holding circuit in the present embodiment.

FIG. 2 is a block diagram indicative of the structure of the detecting and holding circuit 14 in the present embodiment. In FIG. 2, the circuit 14 of FIG. 1 is composed of a band pass filter 17 which limits the frequency band of low frequency signals, an amplifier 18 which amplifies the signals which have passed through the filter 17 to a predetermined level, a level detector 19 which detects signals having a predetermined level and higher amplified by the amplifier 1.8, a comparator 20 which provides an output signal when the output signal from the level detector 19 exceeds a predetermined level, and a memory 21 set by the output signal from the comparator 20. The memory 21 is composed of a capacitor, a latch, a flip-flop, and a RAM, etc., and is reset when it receives an external reset signal.

Figure 3:
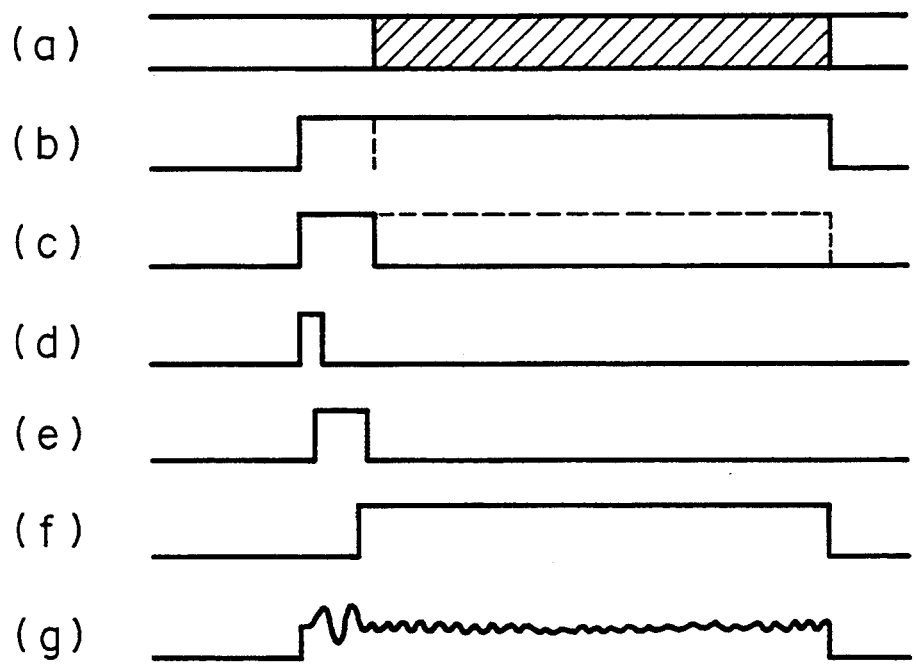
FIG. 3 is a timing chart indicative of the operation of the present embodiment.

The operation of the circuit of FIG. 2 will be described with respect to the timing chart shown in FIG. 3. FIG. 3(a) shows the system of transmitted data in which the hatched portion represents data to be received by the receiver. Generally, the intermittent operation receiver has a built-in synchronizing circuit which controls the receiver such that only when the receiver receives proper data, does it perform in a continuous reception mode for a predetermined interval of time.

FIG. 3(b) shows one example of the intermittent operation control signal. In the present embodiment, when the signal is at high level (hereinafter referred to as "H"), the receiver performs a reception while when the signal is at low level (hereinafter referred to as "L"), it performs no reception. The reason why the timing at which the reception starts due to the intermittent operation control signal of FIG. 3(b) is somewhat earlier than the timing at which the hatched portion of FIG. 3(a) starts is that it takes some time until the receiver performs a stabilized operation after it has started reception of weak input signals. That timing is determined by the synchronizing circuit. Generally, the time taken until its stabilization is reached is decreased when a larger input signal is received.

FIG. 3(c)–(f) are waveform diagrams indicative of the operation timing of the automatic gain control method in the present embodiment. In FIG. 3(c), the receiver performs detection of the level of the received signal strength and the control of the gain of the high frequency unit when the signal is "H" shown by the solid line while it maintains the controlled gain when the control signal is "H" shown by the broken line. The operation timing will be described in more detail below. FIG. 3(d) shows a control signal A which resets the memory 21 of the detecting and holding circuit when the control signal is "H". FIG. 3(e) shows a control signal B which actuates the band pass filter 17, the amplifier 18, the level detector 19, and the comparator 20 of the detecting and holding circuit. These elements operate when the signal B is "H". FIG. 3(f) shows a control signal C which operates the gain control means of the high frequency unit and holds the memory 21 when the control signal C becomes "H" to control the gain of the high frequency unit in accordance with the contents of the memory 21. It also shows that control of the gain of the high frequency unit has been completed before the timing of reception of data for the receiver. FIG. 3(g) is a waveform diagram indicative of an input signal to the level detector 19 of the present embodiment. The reason why there is a difference in rise time between the control signals of FIG. 3(c) and 3(e) is to avoid an erroneous operation due to a transient response after the start of the reception. The reason why the "H" intervals of time of the control signals of FIG. 3(d) and 3(e) overlap is to avoid an erroneous operation of the memory 21 due to transient response by a rise in the control signal of FIG. 3(e).

While one example of the operation timing has been described above, the present invention is not necessarily limited actually to the illustrated timing. A similar operation is possible by performing several changes.

Figure 4:
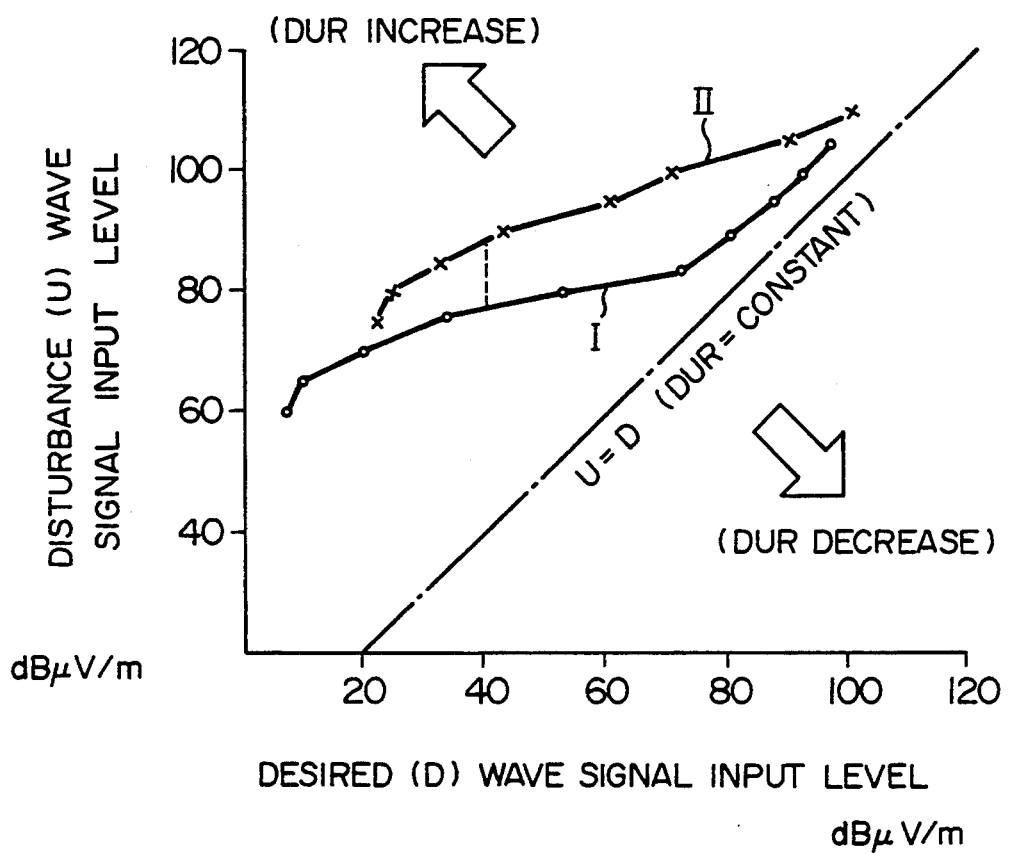
FIG. 4 is a characteristic diagram indicative of effects produced by the present embodiment.

FIG. 4 shows the effects produced by the embodiment of the present invention. It shows the relationship in input signal strength between a desired (D) signal and two undesired (U) signals which cause a disturbance of reception due to third harmonics intermodulation. It shows that when the input signal strength of the U signal is in an extent above curves I or II to that of the D signal, intermodulation causes a disturbance to correct reception of signals. The curve I shows a characteristic present when the gain of the high frequency unit is not decreased and shows that as the input level of the D signal increases, the ratio in input signal strength of the U signal which causes a disturbance to reception to the D signal (hereinafter referred to as DUR) decreases. The curve II shows a characteristic present when the gain of the high frequency unit is decreased by a given value. It will be seen that the DUR present when a high input signal is received in the curve II is excellent compared to that in the curve I. Thus in an automatic gain control method in which, when the received signal strength is detected and when the D signal is high enough, the gain of the high frequency unit is decreased by a given value, a large DUR is obtained over a wide dynamic range of the input level of the D signal.

For example, in FIG. 4, if the system is designed such that the gain of the high frequency unit is decreased by a fixed value by the automatic gain control method of the present invention when the input level of the D signal exceeds 40 dBμV/m, the characteristic traces the curve I of FIG. 4 when the input field level of the D wave is below 40 dBμV/m and traces curve II when it exceeds 40 dBμV/m.

Thus to the present invention reduces disturbance to reception due to intermodulation occur-ring when a high input signal is received.

In the above embodiment, description has been made with only one threshold being used for detection of the received signal strength level. However, setting many thresholds or by effecting fine control of the gain of the high frequency unit, for example, by using an A/D converter, a further improvement of the effects of the present embodiment will be achieved. The present invention is not limited to the direct conversion system, but is also applicable in the conventional heterodyne system.

Figure 5:
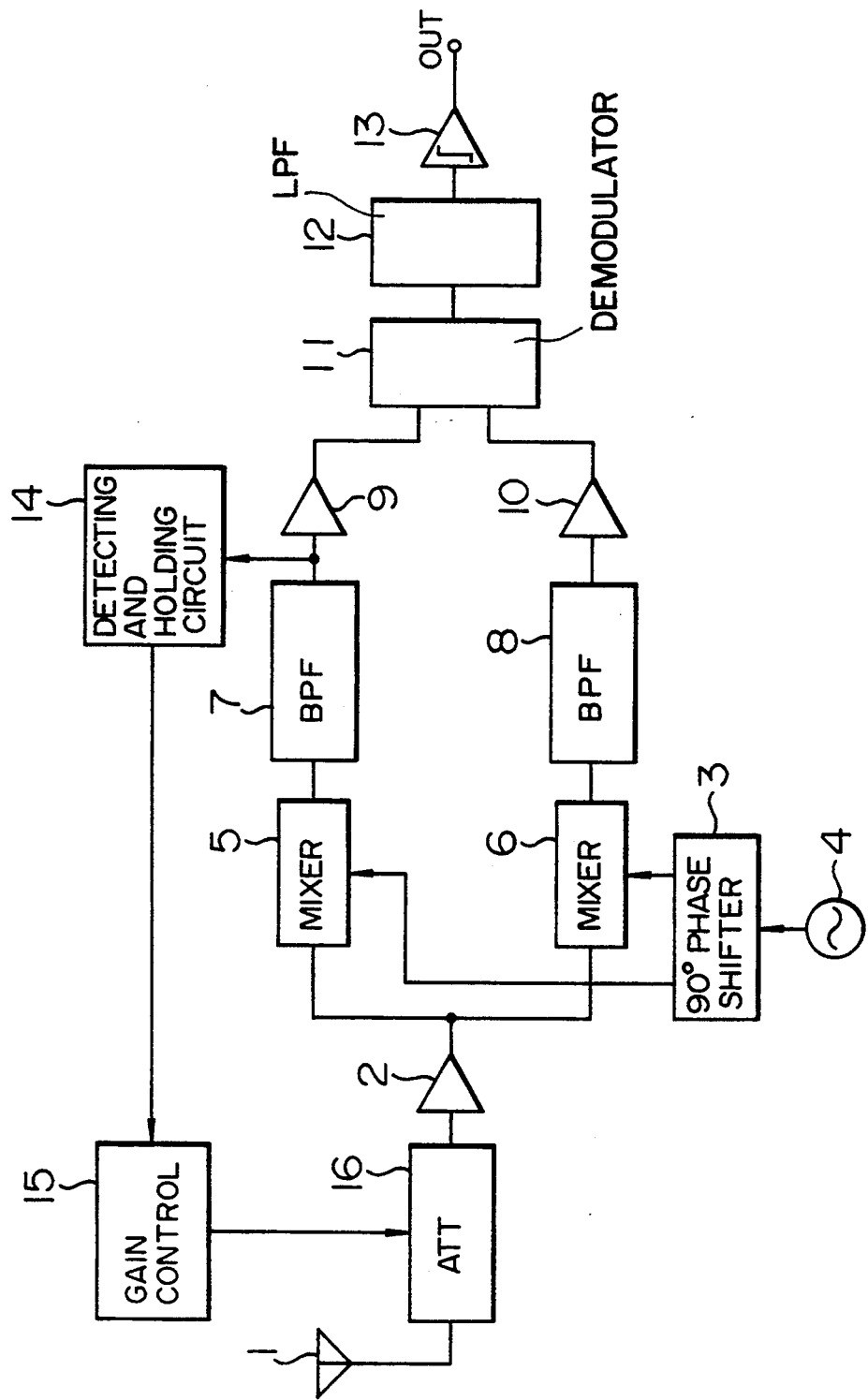
FIG. 5 is a block diagram indicative of the structure of a second embodiment of the present invention.

FIG. 5 is a block diagram indicative of the structure of a second embodiment of the present invention. In FIGS. 5 and 1, like reference numerals are used to denote like elements and further description thereof will be omitted.

The points of the second embodiment different from FIG. 1 the first embodiment are that (1) a variable attenuator 16 is provided as a means for controlling of the gain of the high frequency unit between the antenna and the high frequency amplifier 2 to control the gain of the high frequency unit and (2) an amount of attenuation of the attenuator is controlled in accordance with a signal from the gain control unit 15. This second embodiment produces effects similar to those produced by the first embodiment.

Figure 6:
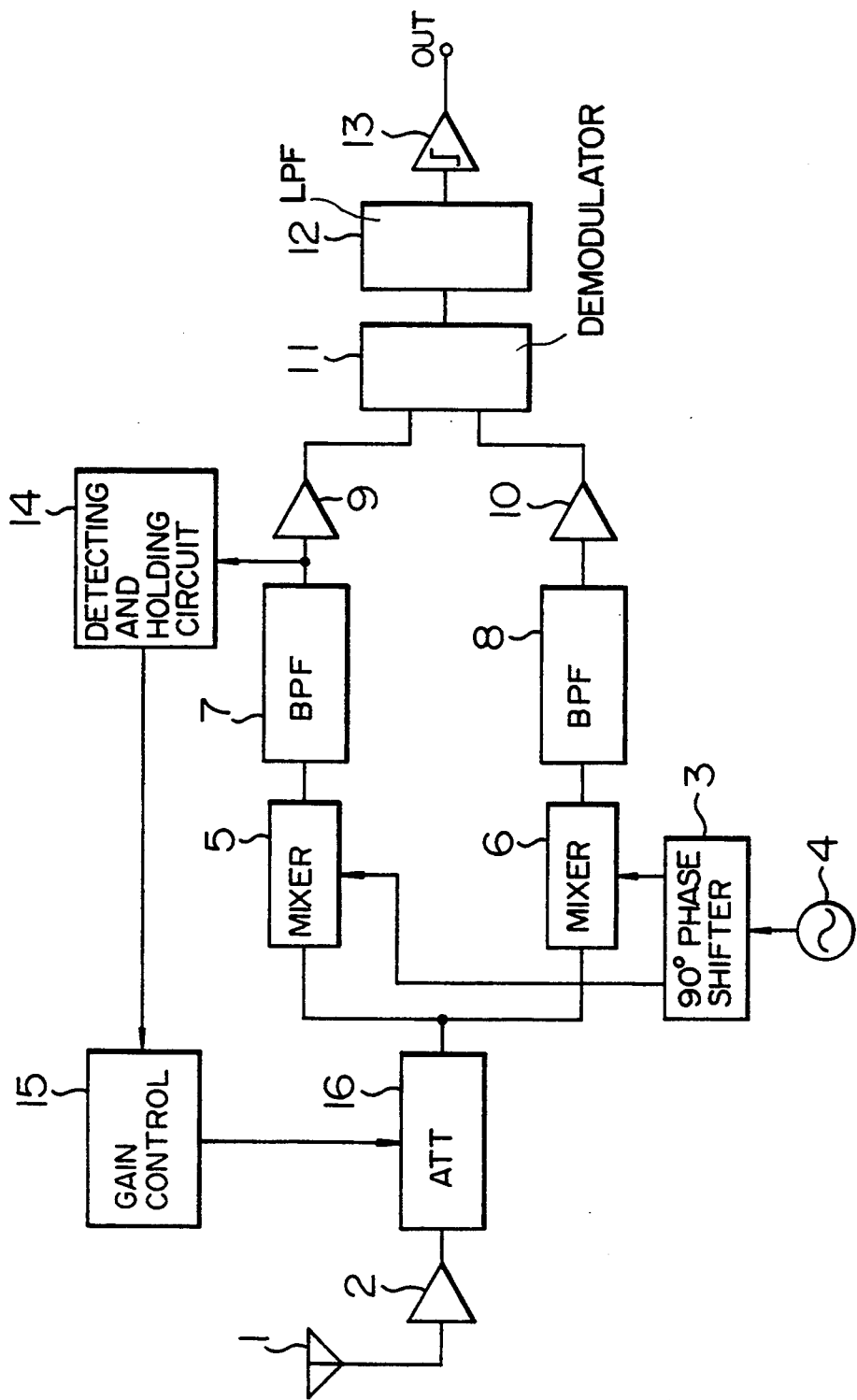
FIG. 6 is a block diagram indicative of the structure of a third embodiment of the present invention.

FIG. 6 is a block diagram indicative of the structure of a third embodiment of the present invention. In FIGS. 6 and 1, like reference numerals denote like elements and further description thereof will be omitted. The points of the third embodiment different from the FIG. 1 embodiment are that a variable attenuator 16 is provided as means for controlling the gain of the high frequency unit between the high frequency amplifier 2 and mixers 5, 6 such that an amount of attenuation of the attenuator 16 is controlled in accordance with a signal from the gain control unit 15. The third embodiment also produces effects similar to those produced by the first embodiment.

Figure 7:
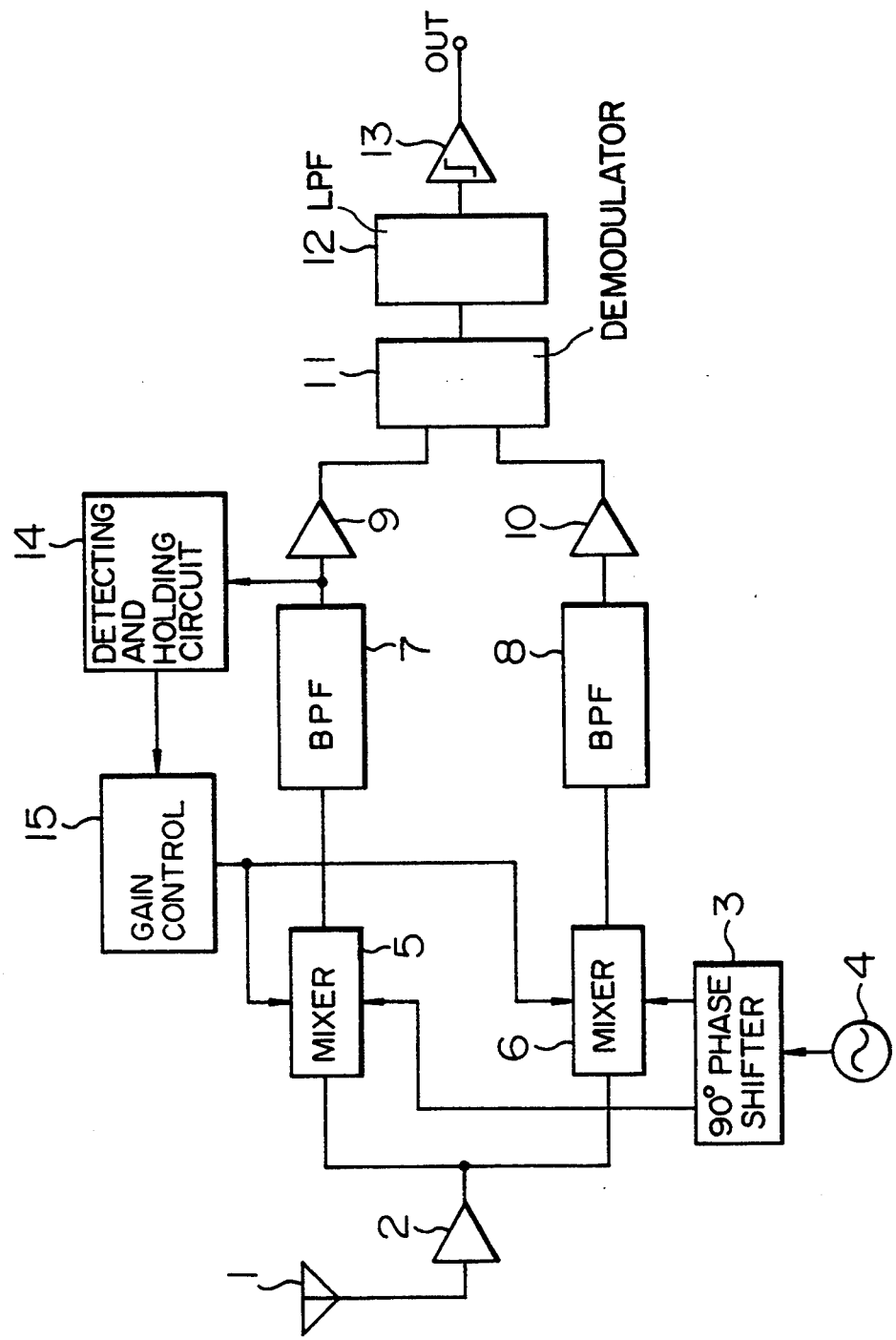
FIG. 7 is a block diagram indicative of the structure of a fourth embodiment of the present invention.

FIG. 7 is a block diagram indicative of the structure of a fourth embodiment of the present invention. In FIGS. 7 and 1, like reference numerals denote like elements and further description thereof will be omitted. The points of the fourth embodiment different from the FIG. 1 embodiment are that a signal from the gain control unit 15 is inputted to mixers 5, 6 to thereby control the conversion gains of the mixers 5, 6 and the input dynamic range in order to control the gain of the high frequency unit. The fourth embodiment also produces effects similar to those produced by the first embodiment.

While in the above embodiments the detecting and holding circuit 14 is described as being connected to the output of one of the band pass filters, the use of both the band pass filter outputs is possible. In addition, the circuit 14 may be connected to the output of the mixers or to a middle point of the limiter amplifier.

As will be apparent from the above embodiments, according to the present invention, the intermittent operation receiver starts to perform a reception operation in accordance with the intermittent operation control signal to effect detection of the received signal strength level and control the gain of the high frequency unit before the interval of time in which a desired signal is received and maintains the controlled gain for that interval of time to thereby control the gain of the high frequency without adversely affecting the reception and hence to reduce disturbance to reception due to intermodulation occurring when a large input signal is received.

We claim:
1. A receiver for receiving a desired signal which is intermittently transmitted for said receiver, said receiver comprising:
an amplifier for amplifying a radio frequency (RF) signal which is obtained by an antenna, said RF signal comprising a sync signal followed by an address signal specifying the receiver;
frequency converting means for converting said RF signal into two low frequency (LF) signals which have different signal phases;
a demodulator for demodulating said two LF signals to obtain a data signal;
timing control means for detecting from said data signal said sync signal and said address signal and for generating at least a first control signal which rises earlier than a time interval of said desired signal and which holds for at least said time interval, a second control signal which rises a predetermined time later than said first control signal and earlier than said time interval and which falls earlier than said time interval, and a third control signal which rises earlier than said second control signal and partially overlaps with said second control signal, in synchronization with said sync signal and said address signal;
means for energizing at least one part of the receiver in response to said first control signal;
a level detector for detecting a level of at least one of said LF signals before said time interval in response to said second control signal, said detected signal level being larger than a first predetermined level;
a comparator for generating an output voltage when said detected signal level is larger than a second predetermined level;
a memory for holding the output voltage of said comparator for at least said time interval, said memory being reset in response to said third control signal; and
level control means for controlling levels of said LF signals in accordance with said detected signal level.

* * * * *